United States Patent

[11] 3,588,745

[72] Inventor Colin D. Hickling
Clarkson, Ontario, Canada
[21] Appl. No. 813,058
[22] Filed Apr. 3, 1969
[45] Patented June 28, 1971
[73] Assignee The Garrett Corporation
Los Angeles, Calif.

[54] PULSE WIDTH MODULATING CIRCUIT PROVIDING HIGH SIGNAL GAIN
9 Claims, 3 Drawing Figs.

[52] U.S. Cl. .......... 332/9, 307/246, 307/265, 328/58
[51] Int. Cl. .......... H03h 7/08
[50] Field of Search .......... 332/99 (T), 14, 15; 307/246, 265, 266, 267; 325/142; 328/58

[56] References Cited
UNITED STATES PATENTS

| | | | |
|---|---|---|---|
| 2,824,287 | 2/1958 | Green et al. | 332/9TX |
| 3,067,393 | 12/1962 | Murray | 332/14 |
| 3,211,926 | 10/1965 | Frysinger | 332/9(TUX) |
| 3,249,895 | 5/1966 | Corney | 332/9(T) |
| 3,393,363 | 7/1968 | Forster | 325/142 |
| 3,440,566 | 4/1969 | Swanson | 332/9(T) |

*Primary Examiner*—Alfred L. Brody
*Attorney*—Fraser and Bogucki

ABSTRACT: A circuit for providing a series of output pulses, the width of which is related to the DC level of an applied input, is disclosed. High, very stable voltage gain is provided in a circuit which utilizes only two transistors as the active elements.

Patented June 28, 1971 3,588,745

INVENTOR.
COLIN D. HICKLING
BY Fraser and Bogucki
ATTORNEYS

PULSE WIDTH MODULATING CIRCUIT PROVIDING HIGH SIGNAL GAIN

BACKGROUND OF THE INVENTION

1. Field of the Invention

This invention relates to amplifying and modulating circuits, and more particularly, to such circuits which provide pulse width modulation in response to an applied voltage level.

2. Description of the Prior Art

Various arrangements have been devised to provide a modulation of output pulse width in response to an applied input signal level. Sometimes such circuits are referred to as amplitude-to-pulse-width converters. Circuits of this type are generally useful as control circuits for achieving a response to a particular kind of control where the monitored output is a signal of a form other than the control input. Such circuits in order to be effective are required to include a pulse generator, preferably synchronized with or serving as a clock pulse source, and to provide substantial gain in the relationship of change of pulse width to change of input signal level. One such circuit in the prior art which utilizes conventional design and operates in response to an oscillator as a synchronizing pulse source includes as individual stages an integrator, a voltage reference, a DC amplifier, a ramp generator, a level detector, and an output pulse amplifier, all of which stages are operated in the conventional circuit to produce a variable pulse width output in response to a variable level DC signal. Several of the stages mentioned employ more than one transistor as the active elements therein, thus providing overall a circuit of considerable complexity. While the circuit referred to is effective for the purpose described, it will be appreciated that performance of the corresponding function in a circuit of substantially fewer individual stages is desirable.

SUMMARY OF THE INVENTION

It is therefore a general object of the present invention to provide an improved pulse width modulating circuit.

It is a more specific object of the present invention to provide a pulse width modulating circuit of simplified construction.

It is a further object of the present invention to provide a high gain, pulse width modulator with a minimum of circuit complexity.

In brief, one particular arrangement in accordance with the present invention utilizes a pair of transistors as active signal responsive elements, together with a capacitor as a charge storage element interconnected in a feedback arrangement to provide a series of stable output pulses variable in width in response to variations in the DC level of a signal applied to the circuit. During a charge storage interval, the level of the applied signal determines the degree of conduction of one of the transistors connected to control the charging rate of the capacitor. At the end of the charging interval, determined when the potential of a point in the charging circuit reaches the turn-on voltage of the second transistor, the second transistor is rendered conducting and, by virtue of a feedback connection from its output to the input of the first transistor, establishes both itself and the first transistor in a saturated condition. Both transistors stay in this condition until a cutoff pulse, typically a synchronizing pulse derived from a repetitive pulse source, is applied to discharge the storage capacitor. At this point the second transistor is turned off and the control of the first transistor is restored to the applied DC signal level. The cycle of operation then repeats. Output pulses are taken from the collector of the second transistor and are variable in duration in accordance with the time it takes for the storage capacitor to charge to the turn-on potential of the second transistor in response to current conducted through the first transistor.

Very stable voltage gain, expressed as a ratio of change in output pulse width for incremental change in voltage level of the signal input, is achieved by arrangements in accordance with the invention on the order of $2\times10^4$ with an input impedance of 1,000 ohms. The output impedance may be any desired value depending solely on the particular transistors employed and the supply voltage. In practice, the output impedance may be as low as 0.5 ohms without negative feedback. Thus it can be seen that extraordinary power gains are possible with such circuits.

In accordance with an aspect of the invention, an impedance element is included in series with the emitter of the first transistor, which element may be varied from a resistor to an inductor or a capacitor in order to develop resistive, differential or integral feedback as desired. Utilization of this element to provide negative feedback to obtain working gains in the transistor stage is effective in realizing complete freedom from transistor parameter drift.

BRIEF DESCRIPTION OF THE DRAWING

A better understanding of the invention may be had from a consideration of the following detailed description, taken in conjunction with the accompanying drawing, in which.

DESCRIPTION OF THE PREFERRED EMBODIMENT

Figure 1:
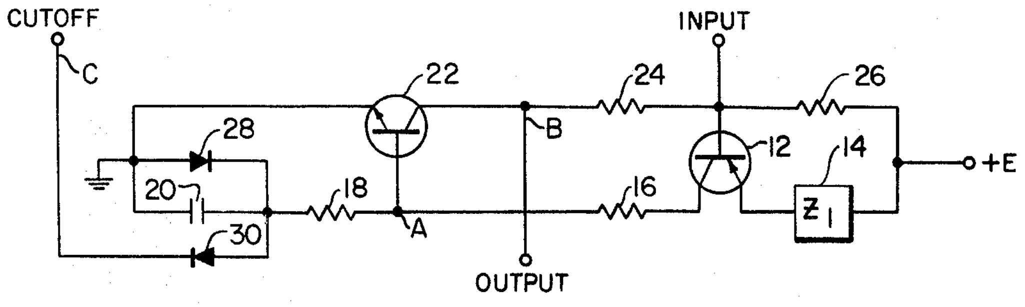
FIG. 1 is a schematic diagram representing one particular arrangement in accordance with the invention.

As represented in the schematic diagram of FIG. 1, a pulse width modulating circuit in accordance with the present invention includes a first transistor 12 having its emitter collector path connected in series with an impedance 14 (designated $Z_1$), a pair of resistors 16 and 18, and a storage capacitor 20 across a difference of potential represented by the designation +E and the symbol for ground as a reference level. A second transistor 22 is shown having its base connected to the common node, designated A, between the resistors 16 and 18. The emitter of the transistor 22 is connected to ground. A resistor 24 provides a feedback path from the collector of the transistor 22 to the base of the transistor 12. Another resistor 26 extends from the base of the transistor 12 to the point of positive potential +E. A clamping diode 28 is connected across the storage capacitor 20 with the polarity as shown. The input to the circuit is shown connected to the base of the transistor 12 and it is this point to which a variable DC level signal may be applied for modulating the width of the output pulses which are taken from the collector of the transistor 22, designated B. Cutoff pulses, utilized for synchronizing the operation of the circuit, may be applied to a point C which is connected to the upper side of the capacitor 20 via a diode 30, connected with the polarity shown for conducting negative polarity cutoff pulses.

Figure 2:
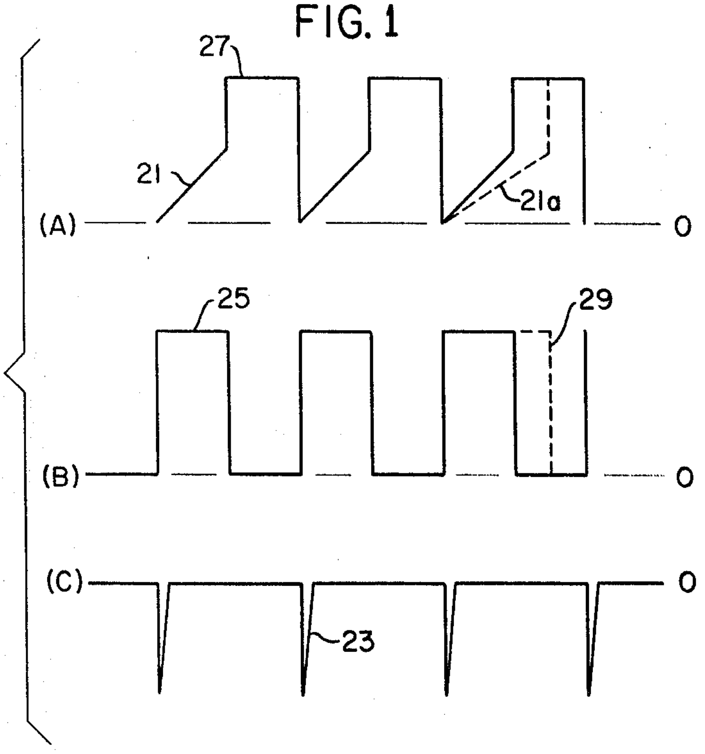
FIG. 2 is a graphical representation of a number of waveforms which are found at different points in the circuit of FIG. 1 during the operation thereof.

The operation of the circuit of FIG. 1 may be better understood by reference to the waveforms (A), (B) and (C) of FIG. 2, which waveforms are taken respectively from the points A, B and C of FIG. 1. A cycle of operation of the circuit of FIG. 1 may begin with zero charge stored on the capacitor 20. For a particular DC level applied at the input of the circuit (the base of the transistor 12), the transistor 12 conducts at a corresponding level to pass current through the charging path via the resistors 16 and 18 and the emitter impedance 14 to build up charge on the capacitor 20. As the capacitor 20 charges in response to this current, the point A connected to the base of the transistor 22 rises positively in potential along the portion 21 of waveform (A) until $V_{BE}$, the turn-on potential of the transistor 22 is reached. The transistor 22 then turns on and, by virtue of the path from the collector of the transistor 22 through the resistor 24 to the base of the transistor 12, immediately increases the base current of the transistor 12. Due to this positive feedback action, both transistors go into saturation almost instantaneously and remain in saturation until a negative synchronizing pulse such as 23 of waveform (C) of FIG. 2 from an associated oscillator circuit (not shown) is applied at the point C. This pulse discharges the capacitor 20 and drops the potential at the base of the transistor 22 below its $V_{BE}$ value, thus turning off the transistor 22 and restoring the transistor 12 to the control of the signal level applied to its base from the input. This completes a cycle of operation of the circuit and the capacitor 20 then begins to charge for the next cycle.

In the waveform (A) of FIG. 2, the ramp portion 21 represents the time during which the capacitor 20 is charging prior to turn-on of the transistor 22. During this time, the potential of the collector of the transistor 22, point B, as indicated by the portion 25 of waveform (B) of FIG. 2, remains at some fixed positive level. However, when the transistor 22 is turned on, the potential of the point B immediately drops to near zero, separated from ground only by the potential $V_{CE}$ of the transistor 22. The charging circuit and the potential of the point A remain stable at a fixed positive level indicated by the portion 27 of waveform (A) until the circuit is turned off by the application of one of the negative synchronizing pulses 23 of the waveform (C) of FIG. 2. Such pulses may be derived from a synchronizing oscillator or, if desired, may be developed from the output of the circuit by a suitable differentiation and inversion with delay.

Variation of the output pulse width (the waveform (B) of FIG. 2) is represented by the broken line 29 in the right-hand pulse of the waveform (B), developed in response to a different charging current as indicated by the broken line 21*a* of the right-hand portion of the waveform (A). This corresponds to a change in the level of the input signal applied to the base of the transistor 12, in a direction to reduce the conductivity of the transistor 12 and therefore to limit the rate of charging of the capacitor 20. Thus, by varying the level of the input signal, the rate of charging the capacitor 20, and therefore the width of the output pulse, may be controlled.

Figure 3:
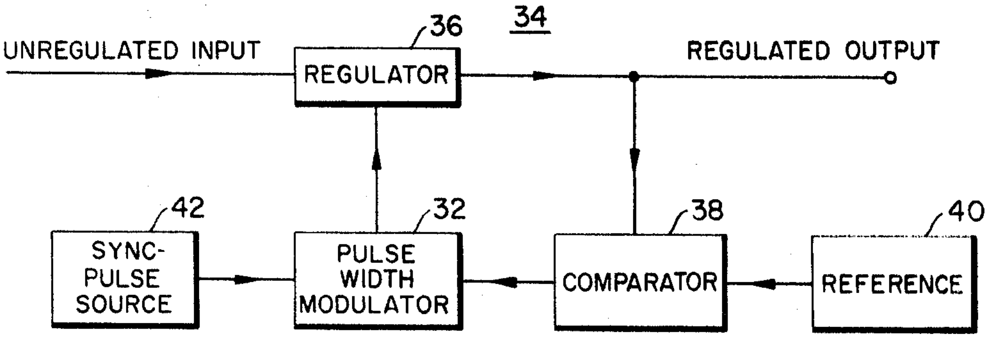
FIG. 3 is a block diagram of a particular system in which the present invention may be employed to advantage.

In the block diagram of FIG. 3, a pulse width modulator 32, which may correspond to the circuit of FIG. 1, is shown connected with associated stages in a voltage regulator system 34. A voltage regulator stage 36 is shown receiving an unregulated input which may typically be developed by a power supply, and is controlled by the pulse width modulator 32 to provide a regulated output. A comparator stage 38 is shown receiving a portion of the regulated output from the regulator 36 for comparison with a potential from a reference stage 40. The result of the comparison of these two inputs is directed to the pulse width modulator stage 32. The stage 32 also receives periodic pulses from a sync pulse source 42 to reset the modulator stage 32 periodically as already described. The output of the pulse width modulator stage 32 is applied to the regulator 36 to control its operation in developing the regulated output voltage. In this system, variations in the output voltage from the regulator 36 may cause the pulse width modulator stage 32 to vary its output pulse width in accordance with the signal level received from the comparator 38 in the manner described in connection with the circuit of FIG. 1 so as to cause the regulator 36 to restore the level of regulated output voltage to that which is desired in accordance with the potential of the reference 40.

It should be clear therefore that an extremely simple, reliable and stable pulse width modulating circuit is provided by the described arrangement in accordance with the invention. For a DC input signal, a pulse width modulated output is obtained directly, with the rise time and the fall time of the output pulse being a function only of the transistor employed as the transistor 22. The circuit described provides high gain, as noted, and a very rapid response time. Furthermore, in the circuit of FIG. 1, the impedance 14 which is shown as a generalized impedance $Z_1$, may be resistive, inductive or capacitive, or some combination of these as desired in order to develop the particular type of feedback needed to stabilize the transistor 12 and make the circuit free from any drift or change in transistor parameters between individual units.

Although there has been described above a specific arrangement of a pulse width modulating circuit with high gain in accordance with the invention for the purpose of illustrating the manner in which the invention may be used to advantage, it will be appreciated that the invention is not limited thereto. Accordingly, any and all modifications, variations or equivalent arrangements occurring to those skilled in the art should be considered within the scope of the invention.

We claim:

1. A pulse width modulating circuit comprising:
first and second controllably conductive elements; means for varying conduction of the first of said elements in accordance with an input signal;
a storage capacitor connected to receive current conducted by the first of said elements;
means connecting the storage capacitor to establish conduction in the second of said elements for potentials across the storage capacitor in excess of a predetermined threshold;
means connecting the second element to the first element in a conditional feedback configuration to establish full conduction in the first element when the second element is conducting so as to maintain both of said elements in a state of full conduction; and
means coupled to the second of said elements for providing output pulses.

2. A circuit in accordance with claim 1 further including:
a circuit path for selectively discharging the storage capacitor in response to applied pulses of a particular polarity in order to restore the second of said elements to its cutoff condition and the first of said elements to a condition responsive to the input signal.

3. A circuit in accordance with claim 1 wherein:
the means for varying conduction of the first of said elements includes means connected to an input of the first of said elements for receiving a variable level DC signal; and
the means for providing output pulses includes means connected to an output terminal of the second element for transferring from the circuit output pulses of variable width corresponding to variations in the level of said DC signal.

4. A circuit in accordance with claim 2 further including:
clamping means coupled to said storage capacitor for limiting the charging of said storage capacitor to a particular polarity.

5. A circuit in accordance with claim 1 further including:
an impedance connected to provide controlled negative feedback to said first element to free the circuit from the effects of variations in the operating parameters of said first element.

6. An electrical circuit for generating a succession of output pulses of variable width in response to variations of level of an applied DC signal comprising:
a storage capacitor;
a first transistor connected to control a rate of charge of the storage capacitor in response to the DC level of an applied signal;
a second transistor coupled to the storage capacitor so as to be controlled by the potential across the storage capacitor;
a feedback path connecting the output of the second transistor to the input of the first transistor so that the first transistor is driven into saturation when the second transistor conducts, the first transistor upon going into saturation causing the second transistor to also saturate;
means for applying operating potentials to the circuit; and
means for applying a cutoff pulse of a selected polarity to the storage capacitor to discharge the storage capacitor and terminate the saturated conditions of said first and second transistors.

7. A pulse width modulating circuit for providing a succession of output pulses of variable width corresponding to the variable level of an applied DC input signal comprising:

first and second transistors, each having base, emitter and collector terminals, the first transistor being of one conduction type and the second transistor being of another conduction type;

first and second resistors respectively connecting the collector of the first transistor to the base of the second transistor and the collector of the second transistor to the base of the first transistor;

a storage capacitor connected between the base of the second transistor and a source of reference potential;

a source of operating potential connected to the base of the first transistor;

means connected to the base of the first transistor for receiving a variable level, DC signal; and means connected to the collector of the second transistor for transferring said output pulses of variable output width corresponding to the variable level of the input signal.

8. A circuit in accordance with claim 7 further including:

means for generating periodic signals of a polarity opposite to the polarity of the operating potentials; and unidirectional current conducting means connected to the storage capacitor and responsive to the periodic signals for discharging said capacitor.

9. A circuit in accordance with claim 8 further including:

a second unidirectional current conducting device connected across the storage capacitor for clamping the storage capacitor at a potential not less than the reference potential.